(12) United States Patent
Yoshimura

(10) Patent No.: US 7,871,856 B2
(45) Date of Patent: Jan. 18, 2011

(54) METHOD AND APPARATUS FOR MANUFACTURING STACKED-TYPE SEMICONDUCTOR DEVICE

(75) Inventor: Atsushi Yoshimura, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1013 days.

(21) Appl. No.: 11/200,037

(22) Filed: Aug. 10, 2005

(65) Prior Publication Data
US 2006/0038275 A1    Feb. 23, 2006

(30) Foreign Application Priority Data
Aug. 11, 2004    (JP) .............................. 2004-234461

(51) Int. Cl.
    *H01L 21/44*    (2006.01)
(52) U.S. Cl. ..................... 438/106; 438/107; 438/127; 257/E23.04
(58) Field of Classification Search ......... 438/455–465, 438/106–127; 257/E23.04
    See application file for complete search history.

(56) References Cited

U.S. PATENT DOCUMENTS

| 6,071,759 | A  |   | 6/2000 | Sugita et al. |
| 6,544,864 | B2 | * | 4/2003 | Reeder et al. ............... 438/455 |
| 6,737,750 | B1 | * | 5/2004 | Hoffman et al. ............ 257/777 |

FOREIGN PATENT DOCUMENTS

| JP | 2000-294723 | 10/2000 |
| JP | 2002-9102 | 1/2002 |
| JP | 2002-294723 | 10/2002 |
| JP | 2003-179092 | 6/2003 |

OTHER PUBLICATIONS

Notification of Reasons for Rejection issued by the Japanese Patent Office on May 22, 2009, for Japanese Patent Application No. 2004-234461, and English-language translation thereof.

* cited by examiner

*Primary Examiner*—H. Jey Tsai
(74) *Attorney, Agent, or Firm*—Finnegan, Henderson, Garrett & Dunner, L.L.P.

(57) ABSTRACT

A method of manufacturing a stacked-type semiconductor device, comprises: arranging a plurality of stacked chips obtained by stacking semiconductor chips on a plurality of stages on a support substrate; connecting a semiconductor chip of each stage in each stacked chip and the support substrate by wire while performing heating in units of stacked chips; performing plastic molding of each stacked chip; and separating the stacked chips from each other; an apparatus for manufacturing a stacked-type semiconductor device, comprising divided heater blocks formed under a support substrate on which a plurality of stacked chips obtained by stacking a plurality of semiconductor chips are arranged, the divided heater blocks being formed with respect to the stacked chips, and a heating device to selectively transmit heat to a stacked chip subjected to a wire bonding.

3 Claims, 4 Drawing Sheets

METHOD AND APPARATUS FOR MANUFACTURING STACKED-TYPE SEMICONDUCTOR DEVICE

CROSS REFERENCE TO RELATED APPLICATIONS

This application is based upon and claims the benefit of priority from the prior Japanese Patent Application No. 2004-234461 filed on Aug. 11, 2004 the entire contents of which are incorporated herein by reference.

BACKGROUND OF THE INVENTION

1. Field of the Invention

The present invention relates to a method of manufacturing a stacked-type semiconductor device in which plurality of semiconductor chips are stacked and an apparatus for manufacturing a stacked-type semiconductor device to realize the manufacturing method.

1. Related Art

Upon the recent demand for multifunctionality of a semiconductor device, to realize advancement in a small occupied area, a stacked-type semiconductor technique, which stacks a plurality of semiconductor chips in a multistage in one package, fixes the semiconductor chips with an adhesive agent and performs necessary interlayer wiring, is popularized.

The stacked-type semiconductor device is disclosed in, e.g., Japanese Patent Application Laid-open No. 2002-294723. A lowermost substrate is a support substrate in which vertical through holes (or via holes) are formed. In this example, the rear surfaces of two semiconductor chips matched to each other and stacked through a heat-radiating adhesive agent, and the upper semiconductor chip and the support substrate are connected by wires.

Application of the technique makes it possible to form a stacked-type semiconductor device having a large number of stages, i.e., three or more layers.

When wire bonding is performed between a semiconductor chip on each stacked stage and a support substrate of multi-stage in the stacked-type semiconductor device including a large number of stages, it is physically impossible to simultaneously perform bonding of the stacked stages. For this reason, wire bonding is performed every stacked stage. When this connection is performed, the temperature of a connection portion must be increased to improve reliability of the connection within a short period of time. For this reason, heating is required and generally achieved such that stacked chip to be heated is heated by a bonding heater.

A plurality of stacked structures are formed in the form of a matrix on a large support substrate in manufacturing a stacked-type semiconductor device, and the stacked structures are separated from each other upon completion of the semiconductor devices.

However, since conventional heating is to heat a support substrate as a whole, the heating is devised by using a column mechanism or the like such that the support substrate is entirely heated each time one stacked chip is formed to avoid continuous heating. However, the stacked chips must be heated for a period of time required to heat all the stacked chips in the matrix.

As described above, in the conventional technique, the substrate is entirely heated, so that the lowermost chips in the stacked layers especially receive thermal histories in units of matrix frames times the number of which is equal to the number of times of wire bonding. The large number of thermal histories deteriorate an adhesive agent holding the stacked stage, and peeling disadvantageously occurs when the semiconductors are mounted on substrates.

SUMMARY OF THE INVENTION

According to one aspect of the present invention, there is provided a method of manufacturing a stacked-type semiconductor device, comprising:

arranging a plurality of stacked chips obtained by stacking semiconductor chips on a plurality of stages on a support substrate;

connecting a semiconductor chip of each stage in each stacked chip and the support substrate by wire while performing heating in units of stacked chips;

performing plastic molding of each stacked chip; and separating the stacked chips from each other.

According to another aspect of the invention, there is provided an apparatus for manufacturing a stacked-type semiconductor device, comprising:

divided heater blocks formed under a support substrate on which a plurality of stacked chips obtained by stacking a plurality of semiconductor chips are arranged, the divided heater blocks being formed with respect to the stacked chips, and wherein the divided heater blocks are designed to selectively transmit heat to the stacked chip subjected to a wire bonding operation.

DETAILED DESCRIPTION OF THE INVENTION

Several embodiments of the present invention will be described below with reference to the accompanying drawings.

Figure 1:
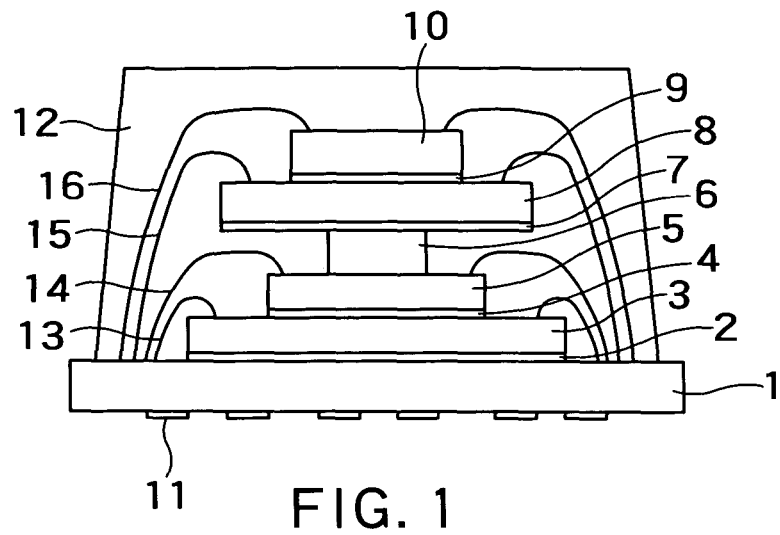
FIG. 1 is a sectional view of a stacked-type semiconductor device to which the present invention is applied.

FIG. 1 is a sectional view showing a configuration of a stacked-type semiconductor device 100 applied to the present invention.

On a support substrate 1 having connection electrodes 11 such as bumps formed on the rear surface, a first semiconductor chip 3 is mounted through an adhesive agent layer 2. A second semiconductor chip 5 smaller than the first semiconductor chip is mounted on the first semiconductor chip through an adhesive agent layer 4. A spacer 6 is arranged on the second semiconductor chip, and a third semiconductor chip 8 smaller than the first semiconductor chip 3 and larger than the second semiconductor chip is mounted on the spacer 6 through an adhesive agent layer 7. Furthermore, a fourth semiconductor chip smaller than the third semiconductor chip is mounted on the third semiconductor chip 8 through an adhesive agent layer 9. In this stacked structure, the second semiconductor chip 5 is smaller than the first semiconductor chip 3, and the fourth semiconductor chip is smaller than the third semiconductor chip to easily perform wire bonding. More specifically, the electrodes of the first to fourth semiconductor chips are connected to the electrodes on the support substrate 1 by wires 13, 14, 15, and 16 to prevent the electrode positions on the chips from shifting and crossing in the horizontal and vertical directions. The wire bonding is performed because the wires have high reliability and high flexibility.

The use of the spacer 6 makes it possible to stack the third semiconductor chip 8 larger than the spacer 6 by forming the spacer 6.

In the stacked-type semiconductor device, adhesive layers are formed on the lower surfaces of the semiconductor chips to constitute stages, the semiconductor chips are stacked and fixed at a predetermined position, and the stacked structure is fixed on the support substrate by die bonding. Since the die bonding is performed at a temperature of, e.g., 150° C. for one second, curing is performed at the same temperature for about 1 hour in an oven to prevent warpage or the like of the substrate.

In the wire bonding step, heating is performed at a temperature of, e.g., 175° C. for about 15 minutes.

The entire structure is molded with plastic upon completion of the wire bonding to form a plastic-molded structure 12. Dicing is performed to separate chips from each other to complete stacked-type semiconductor devices.

Figure 2:
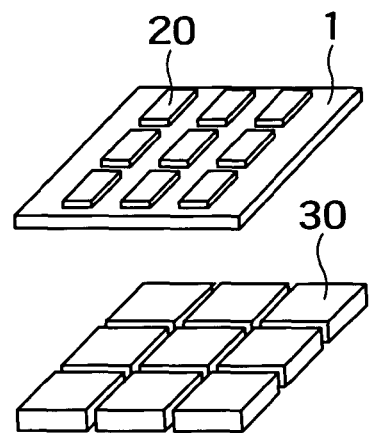
FIG. 2 is a perspective view showing divided heater blocks used in a manufacturing method according to the present invention.

FIG. 2 is a perspective view showing an embodiment of a method of manufacturing a stacked-type semiconductor device according to the present invention. As shown in FIG. 2, a large number of stacked chips 20 are formed on the support substrate 1 in the form of a matrix, and divided heaters 30 are arranged under the stacked chips 20 with respect to each other. In FIG. 2, nine stacked chips are arranged in a 3×3 matrix. However, the number of chips can be appropriately selected in consideration of the size of the substrate, the sizes of the chips, and the like.

The applied heater is, for example, a ceramic heater or an infrared heater. As control methods for the heater, any available method such as a pulse control method or a voltage-current control method can be used.

Figure 3:
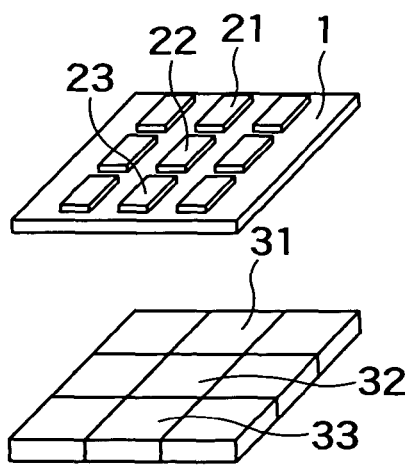
FIG. 3 is a perspective view for explaining heating control of divided heater blocks in the manufacturing method according to the present invention.

The block parts of the divided heaters 30 are designed to be able to be independently controlled in temperature. Therefore, as shown in FIG. 3, when a wire bonding operation is performed to a stacked chip 21 at the present, a heater to be heated heats a heater block 31 immediately under the stacked chip 21. When the wire bonding operation is performed to the next stacked chip 22, the heater block to be heated shifts to a heater block 32 immediately under the heat block. A heater block to be heated next sequentially shifts to a heater block 33 corresponding to a stacked chip 23. The shift is performed on the entire support substrate to perform the wire bonding operations to all the stacked chips.

Figure 4:
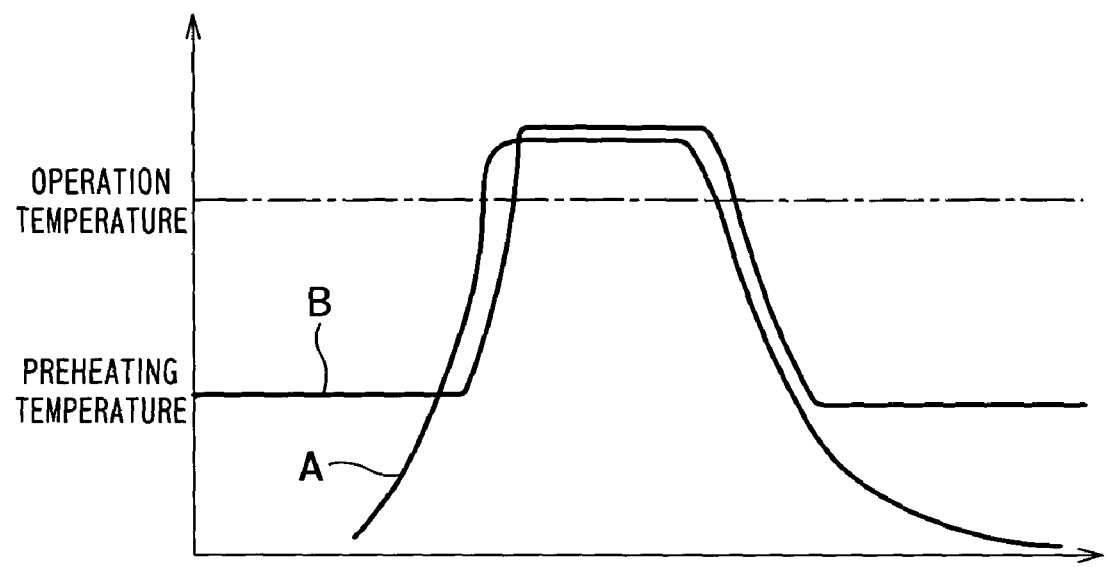
FIG. 4 is a graph for explaining a temperature control pattern of the divided heat blocks in a manufacturing apparatus according to the present invention.

In this heating, a target heater block may be turned on/off as shown by a pattern A in FIG. 4. However, in order to accelerate the heating operation, as shown by a pattern B in FIG. 4, a low current is caused to flow in all the heater blocks from the start of the heating operation, so that the temperature of the heater blocks reach a predetermined preheating temperature lower than the operation temperature. In wire bonding, a high current is caused to flow in the heat blocks to increase the temperature of the target heat block to the operation temperature or more, so that the target stacked chip can be heated.

Temperature management of the respective heat blocks can be easily controlled in accordance with the progress of the operation.

The division of the heater blocks may be performed such that not only one stacked chip is heated as in the embodiment but also stacked chips are heated in units of rows or columns of a matrix.

Figure 5:
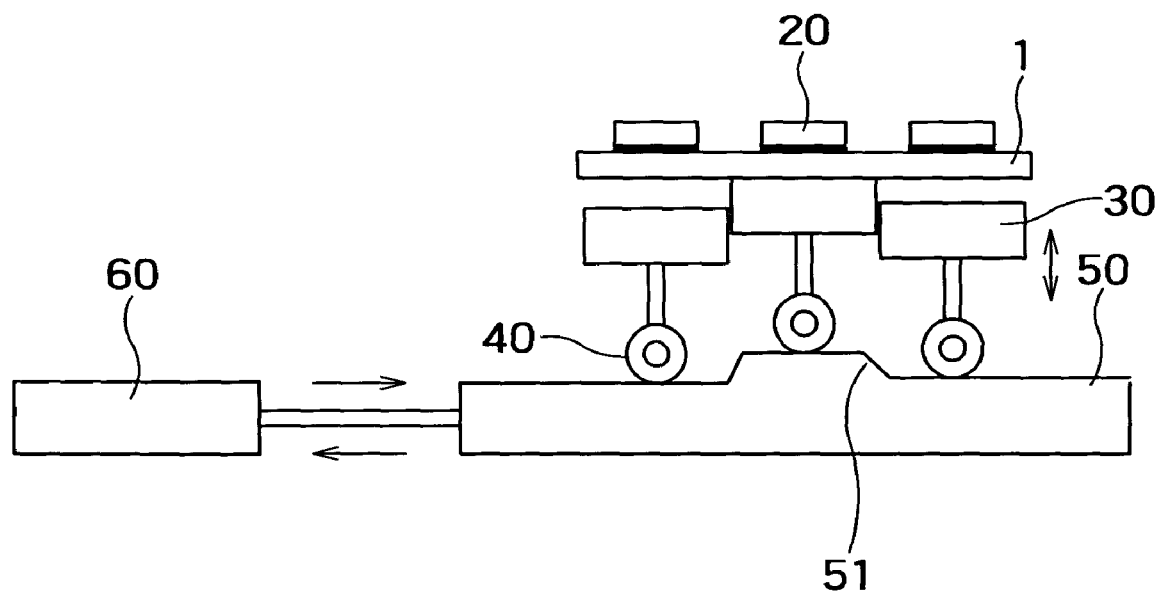
FIG. 5 is a diagram for explaining a vertical moving mechanism using a cam in the manufacturing apparatus according to the present invention.

FIG. 5 is a conceptual diagram showing another embodiment of a method of manufacturing a semiconductor device according to the present invention. In this embodiment, a divided heater block shown in FIG. 2 is selectively vertically moved by a cam mechanism, so that the heater block is brought into direct contact with the lower surface of a stacked chip to be wire-bonded. More specifically, the heater blocks 30 can be vertically moved. Rollers 40 as cam followers are provided under the heater blocks 30. The follower rollers 40 are placed on a cam plate 50 having a raised portion corresponding to one heater block. The cam plate 50 is connected to a cylinder 60 arranged on a side of the cam plate 50 so that the cam plate 50 can be moved in the expansion/contraction direction of the cylinder. Therefore, the cylinder 60 is controlled to locate the raised portion 51 immediately under a stacked chip to be wire-bonded, so that only the stacked chip can be heated.

In this manner, the heater is mechanically approximated to a target stacked chip to make it unnecessary to complex temperature management for respective heaters.

Figure 6:
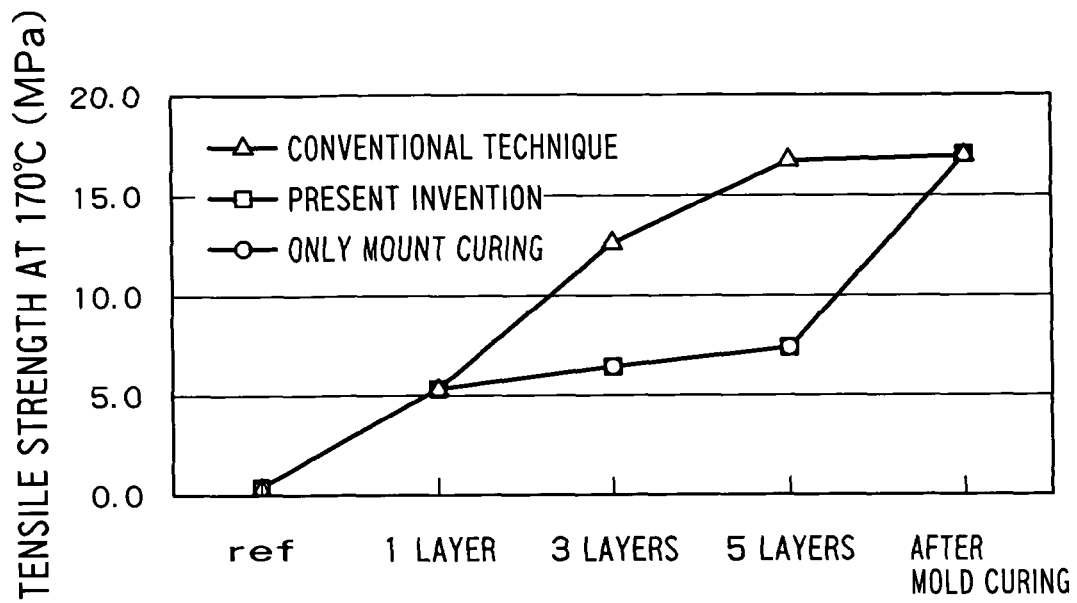
FIG. 6 is a graph showing an effect obtained by the manufacturing method according to the present invention.

FIG. 6 is a graph showing an effect obtained by the present invention. The graph shows a relationship between an increase in thermal history when wire bonding at 175° C. is repeated and molding is performed at last and tensile strengths (MPa) of adhesive agents of stacked chips. According to this graph, in conventional overall heating, the cured adhesive agents of the third and subsequent layers are considerably brittle. In contrast to this, in the present invention, it is understood that, even though the number of layers of the stacked chips is five, curing of the adhesive agents does not excessively advance. In the graph, a case in which only a stacking process is performed without performing wire bonding is shows as a comparative example. Values obtained in this comparative are exactly equal to the values obtained in the present invention. It is understood that the stacked chips are not adversely affected by embrittlement caused by conventional overall heating when the present invention is applied.

Figure 7:
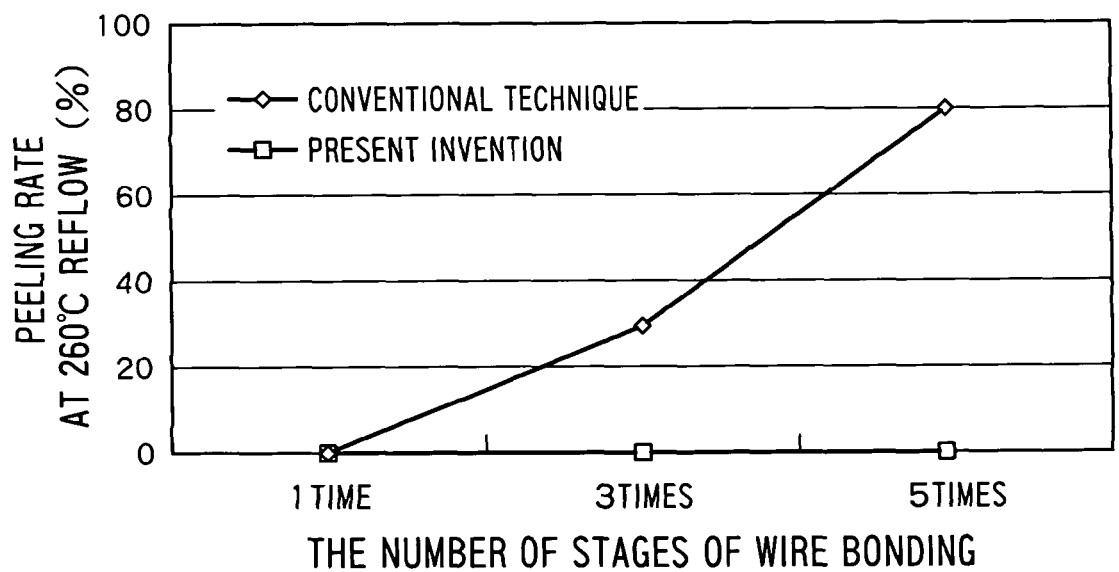
FIG. 7 is another graph showing the effect obtained by the manufacturing method according to the present invention.

FIG. 7 is another graph showing the effect obtained by the present invention. The graph shows a relationship between the number of wire bonding steps when reflow is performed at 260° C. and a peeling rate of an adhesive agent. In the conventional technique, as the number of times of wire bonding, the peeling rate considerably increases. In the present invention, peeling is not observed at all. It is understood that the advantage is achieved because the embrittlement of the material does not advance in FIG.6.

Figure 8:
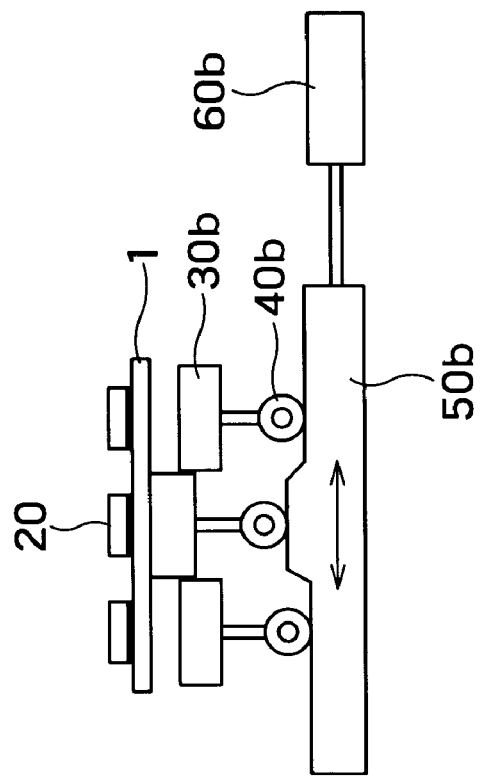
FIG. 8 is a diagram showing a variation of the manufacturing apparatus having dual structures of FIG. 5 according to the present invention.
Figure 8:
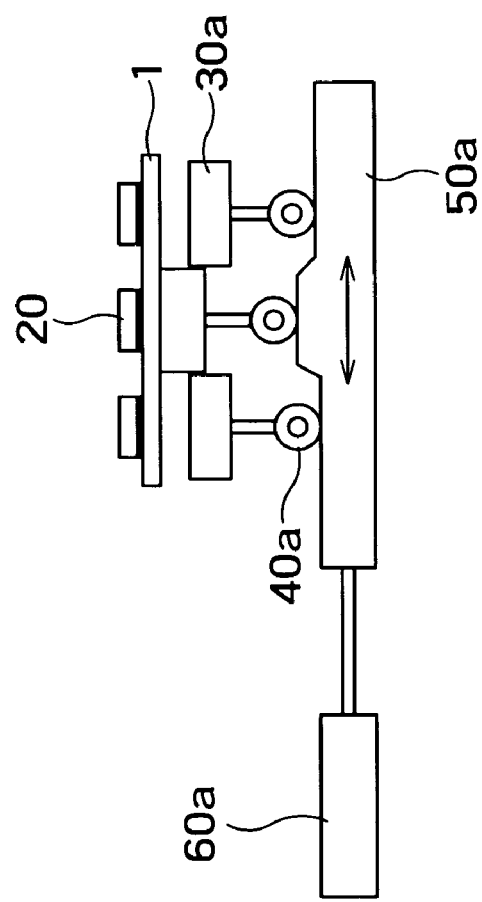

FIG. 8 is a conceptual diagram showing another embodiment of a method of manufacturing a semiconductor device according to the present invention. In this embodiment, a plurality of heating devices shown in FIG. 5 are provided. More specifically, in FIG. 8, two of heating devices shown in FIG. 5 are serially and symmetrically disposed. In FIG. 8, the same elements as in FIG. 5 are given the same reference numerals, but accompanied suffix a in the left side and b in the right side. The reason why the two heating mechanisms are disposed symmetrically is to avoid collision of the cam plates and cylinders.

This structure enables two heating procedures at the same time and result in doubled productivity.

It is apparent that further heating mechanisms can be disposed in the direction perpendicular to the drawing, namely in parallel.

As described above, according to the present invention, when a multilayer package using a matrix frame in which semiconductor chips are stacked on several stages and electrically connected to a substrate by wire bonding is formed, a heater does not heat the entire surface of the semiconductor chips but locally heats only a chip to be bonded. For this reason, a thermal history per chip is reduced to make it possible to prevent adhesive agents between the chip and the substrate and between the lower chip and the upper chip from being deteriorated.

What is claimed is:

1. A method of manufacturing a stacked-type semiconductor device, comprising:
    arranging a plurality of chip stacks obtained by stacking semiconductor chips on a plurality of stages in one surface direction on a support substrate;
    setting the plurality of chip stacks at a preliminary temperature;
    heating each of the plurality of chip stacks in sequence at a temperature higher than the preliminary temperature, and connecting a semiconductor chip of each stage in each heated chip stack and the support substrate by wire;
    performing plastic molding of each chip stack; and
    separating the chip stacks from each other,
    wherein the heating in units of chip stacks is performed by divided heater blocks arranged with respect to the chip stacks.

2. The method of manufacturing a stacked-type semiconductor device according to claim 1, wherein the divided heater block is selectively heated in relation to a chip stack to be wire-bonded.

3. The method of manufacturing a stacked-type semiconductor device according to claim 1, wherein the divided heater block is disposed near to a corresponding one of the chip stacks when the corresponding one of the chip stacks is wire-bonded.

* * * * *